United States Patent [19]

Wang et al.

[11] Patent Number: 5,895,269

[45] Date of Patent: Apr. 20, 1999

[54] METHODS FOR PREVENTING DELETERIOUS PUNCH-THROUGH DURING LOCAL INTERCONNECT FORMATION

[75] Inventors: Fei Wang, San Jose; Minh Van Ngo, Union City; Darin A. Chan, Campbell; David K. Foote, San Jose; William G. En, Milpitas, all of Calif.

[73] Assignee: Advanced Micro Devices, Inc., Sunnyvale, Calif.

[21] Appl. No.: 08/993,887

[22] Filed: Dec. 18, 1997

[51] Int. Cl.[6] .................. H01L 21/28; H01L 21/3205

[52] U.S. Cl. .................. 438/675; 438/675; 438/586

[58] Field of Search .................. 438/675, 668, 438/639, 637, 629

[56] References Cited

U.S. PATENT DOCUMENTS

| | | | |
|---|---|---|---|
| 5,266,156 | 11/1993 | Nasr | 438/384 |
| 5,602,055 | 2/1997 | Nicholls et al. | 438/675 |
| 5,652,182 | 7/1997 | Cleeves | 438/631 |

*Primary Examiner*—Bruce Breneman
*Assistant Examiner*—Lynette T. Umez-Eronini

[57] ABSTRACT

During damascene formation of local interconnects in a semiconductor wafer, a punch-through region can be formed into the substrate as a result of exposing the oxide spacers that are adjacent to a transistor gate to one or more etching plasmas that are used to etch one or more overlying dielectric layers. A punch-through region can damage the transistor circuit. In order to prevent punch-through, the oxide spacers are removed prior to forming an overlying dielectric layer.

10 Claims, 3 Drawing Sheets

METHODS FOR PREVENTING DELETERIOUS PUNCH-THROUGH DURING LOCAL INTERCONNECT FORMATION

TECHNICAL FIELD

The present invention relates to semiconductor devices and manufacturing processes, and more particularly to methods for preventing punch-through during the formation of local interconnections within a semiconductor device.

BACKGROUND ART

A continuing trend in semiconductor technology is to build integrated circuits with more and/or faster semiconductor devices. The drive toward this ultra large-scale integration (ULSI) has resulted in continued shrinking of device and circuit features. To take advantage of increasing number of devices and to form them into one or more circuits, the various devices need to be interconnected.

To accomplish interconnection on such a small scale, a local interconnect is typically used within an integrated circuit to provide an electrical connection between two or more conducting or semi-conducting regions (e.g., active regions of one or more devices). For example, a plurality of transistors can be connected to form an inverting logical circuit using a local interconnect.

The local interconnect is typically a relatively low-resistance material, such as a conductor or doped semiconductor, that is formed to electrically couple the selected regions. For example, in certain arrangements, damascene techniques are used to provide local interconnects made of tungsten (W), or a like conductor, which is deposited within an etched opening, such as a via or trench that connects the selected regions together. The use of local interconnects reduces the coupling burden on the subsequently formed higher layers to provide such connectivity, which reduces the overall circuit size and as such tends to increase the circuit'performance. Accordingly, as the density of the circuits increase there is a continuing need for more efficient, effective and precise processes for forming smaller local interconnects.

With this in mind, FIG. 1 depicts a cross-section of a portion 10 of a prior-art semiconductor wafer having a stop layer 22 and a dielectric layer 26 as prepared for local interconnect processing using conventional deposition processes. As shown, portion 10 includes a substrate 12 in which one or more devices have been formed. By way of example, portion 10 includes a gate 16 that is part of a field effect transistor having a source region 24a and a drain region 24b formed within substrate 12, as is known in the art. Gate 16 is typically a conductive material or a semi-conductive material, such as, for example, a doped polycrystalline silicon (referred to hereinafter as polysilicon), which has been formed on a gate oxide 14 (e.g., silicon dioxide $SiO_2$) on top of substrate 12. A dielectric spacer 20 has been added to each of the vertical sidewalls of gate 16 and the exposed top surface of gate 16 has a conductive silicide 18 formed thereon. Stop layer 22, which is a dielectric material, such as, for example, silicon nitride (e.g., $Si_3N_4$), has been deposited over the exposed surfaces of portion 10 using a stop layer deposition process. Dielectric layer 26, such as, for example, tetraethlorthosilicate (TEOS) oxide, has been deposited over stop layer 22 using a conventional deposition process.

Although stop layer 22 and dielectric layer 26 are both dielectric materials, preferably they are different enough in composition such that subsequent etching processes are capable of etching through dielectric layer 26 while essentially stopping on stop layer 22, thereby avoiding the possibility of etching into substrate 12 and the device regions formed therein. In this manner, stop layer 22 tends to provide improved process control in the formation of local interconnects that are formed using damascene techniques.

The continued shrinkage of the critical dimensions of the various components, layers and film, for example in portion 10 of FIG. 1, places new challenges on those seeking to maintain process control. One of these challenges is to maintain control over the dielectric etching process during local interconnect formation, and in particular effectively stopping on stop layer 22.

To help address this problem improved materials and/or etching processes have been developed, and continue to be developed, so as to increase the selectivity of the dielectric etching process to stop layer 22. Unfortunately, these improvements have yet to lead to a process that exhibits perfect selectivity between the dielectric layer 26 and stop layer 22. Consequently, it is possible to over-etch portions of stop layer 22 and "punch-through" to substrate 12 during the dielectric etching process, especially if stop layer 22 is very thin.

This is especially true for high aspect ratio local interconnect trenches/vias that are formed over a non-planar underlying topology. The high aspect ratios (e.g., a ratio of the trench's height to width) and uneven topology of these types of local interconnects usually requires an etching process that is longer in duration so as to effectively etch away dielectric layer 26. For example, if a local interconnect is formed to electrically connect drain region 24b and gate 16, the corner of gate 16 and the curvature of spacer 20 form an uneven topology. Consequently, during the local interconnect etching process, the newly exposed portions of stop layer 22 over the corner of gate 16 and over spacer 18 will be exposed to the etching materials while the remaining areas of dielectric layer 26 are etched away to reveal substrate 12/drain region 24b. In this example, over-etching and/or punch-through occurs if stop layer 22 is breached during the etching of dielectric layer 26 and spacer 18 is etched wholly or partially away as a result. This problem is exacerbated by further dimensional reductions that tend to further reduce the thickness of stop layer 22 and spacer 18 while increasing the aspect ratio of the local interconnect trench/via.

Thus, there is a continuing need for improved methods that increase the process control and prevent over-etching or punch-through during the formation of local interconnects.

SUMMARY OF THE INVENTION

The present invention provides methods that increase the process control during the formation of local interconnects by altering the structure of the gate arrangement of a transistor so as to prevent possible punch-through into the underlying substrate while forming openings that are used for the local interconnect.

Thus, in accordance with one aspect of the present invention, there is provided a method for avoiding over-etching into an underlying substrate during the formation of local interconnects in a semiconductor wafer. The method includes forming a semiconductor device having a gate arrangement, a source region and a drain region. The source region and the drain region are formed within a substrate. The gate arrangement is formed on the substrate and includes a gate and at least one dielectric spacer that contacts the gate and the substrate. The method includes removing at least a substantial portion of the spacer from the transistor and then forming a first dielectric layer over at least a portion of the transistor.

In accordance with certain embodiments of the present invention, the method further includes selectively removing a portion of the first dielectric layer to expose a portion of the underlying transistor through an opening, and creating a local interconnect by filling at least a portion of the opening with at least one electrically conductive material. In one embodiment, the gate arrangement further includes a silicon dioxide layer that is on the substrate and has a polysilicon gate formed thereon. In certain embodiments, the spacer includes oxide or nitride.

In still other embodiments, the method further includes forming a second dielectric layer of a different material over the first dielectric layer. As such the method can also include selectively removing a portion of the first and second dielectric layers to expose a portion of the transistor through an opening. For example, in one embodiment, the first and second dielectric layers are removed in an etching tool that uses a first plasma to anisotropically etch through the first dielectric layer and a second plasma to anisotropically etch through the second dielectric layer. In one embodiment, at least a substantial portion of the spacer is also removed using an etching tool that is configured to isotropically etch away the spacer.

The foregoing and other features, aspects and advantages of the present invention will become more apparent from the following detailed description of the present invention when taken in conjunction with the accompanying drawings.

BRIEF DESCRIPTION OF THE DRAWINGS

The present invention is illustrated by way of example, and not by way of limitation, in the figures of the accompanying drawings and in which like reference numerals refer to similar elements in which.

DETAILED DESCRIPTION OF THE EXEMPLARY EMBODIMENTS

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-sections of portions of an integrated circuit device during fabrication are not drawn to scale, but instead are drawn to illustrate the features of the present invention.

In accordance with certain embodiments of the present invention, methods are provided that significantly reduce punch-through effects during the formation of local interconnects. As part of the present invention, it was recognized that the dielectric spacers that are used to form the source and drain regions within the substrate can lead to over-etching or punch-through into the substrate during the etching of the overlying dielectric and stop layers. Thus, in accordance with the present invention, the spacers are removed prior to the formation of the stop and dielectric layers. As such, the methods of the present invention increase the process control during local interconnect etching and fabrication processes by significantly reducing punch-through and/or over-etching into the substrate.

Figure 1:
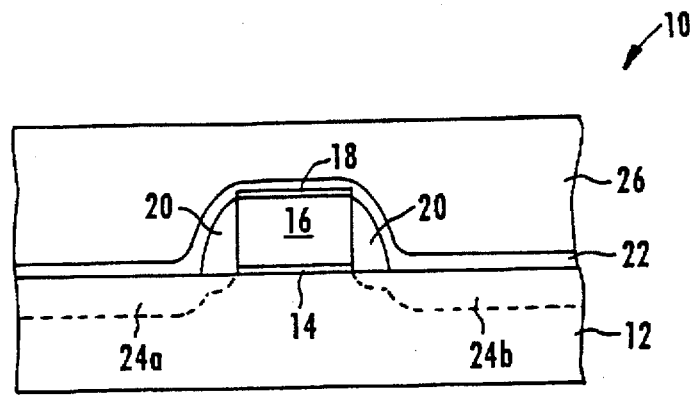
FIG. 1 depicts a cross-section of a portion of a prior-art semiconductor wafer that has a stop layer, a dielectric layer, and a substrate.
Figure 2A:
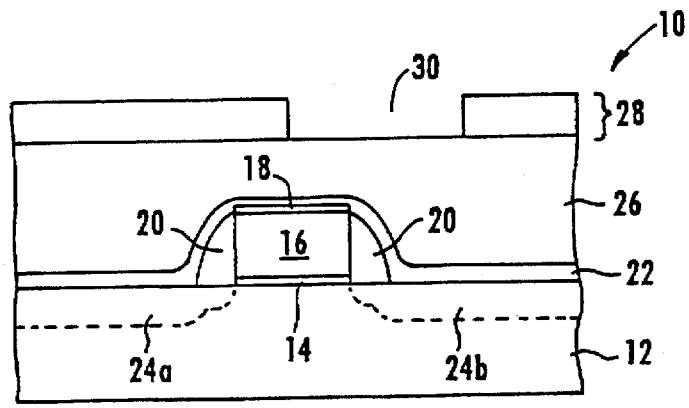
FIG. 2a depicts the portion in FIG. 1 having a patterned resist mask formed thereon for use in forming an etched opening that can be filled to create a local interconnect.
Figure 2B:
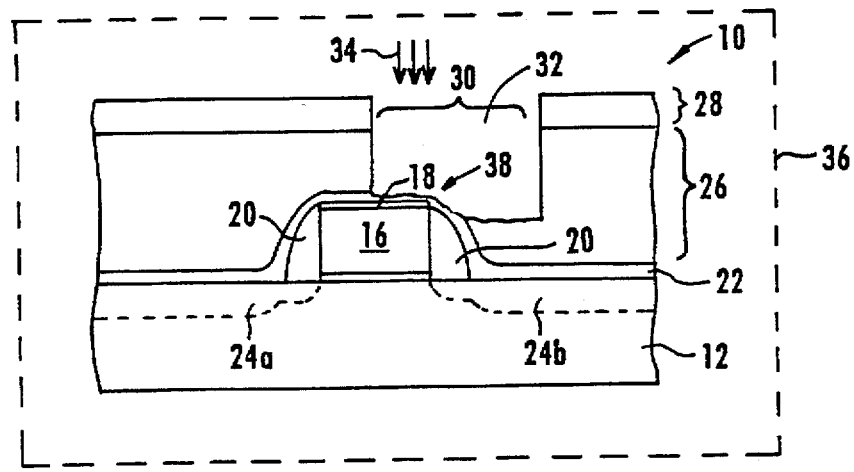
FIG. 2b depicts the portion of FIG. 2a during a dielectric layer etching process in which an initial etched opening is formed.
Figure 2C:
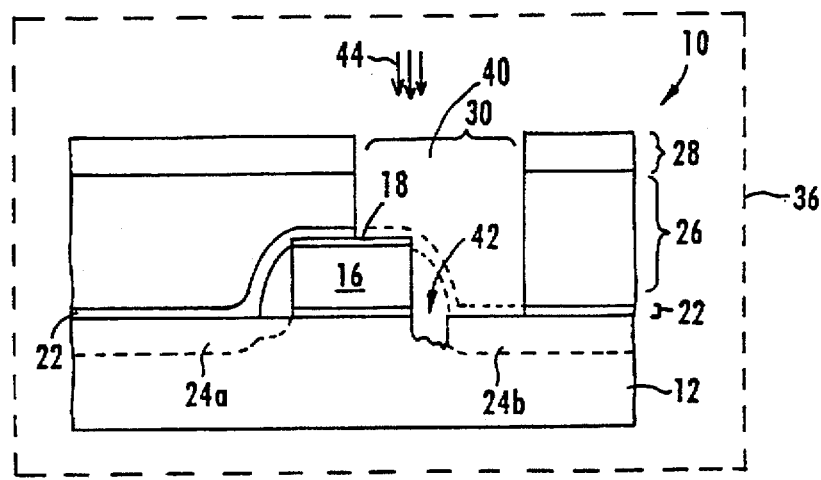
FIG. 2c depicts the portion of FIG. 2b that has a deleterious punch-through region that extends into the substrate following a dielectric layer etching process and a stop layer etching process.

FIGS. 2a through 2c show the prior-art portion 10 of FIG. 1 before, during and following, respectively, dielectric layer and stop layer etching processes. In FIG. 2a, a patterned resist mask has been formed over dielectric layer 26. Patterned resist mask 28 has an etch window 30 that exposes a portion of dielectric layer 26. In FIG. 2b, portion 10 has been placed within an etching tool 36 and a dielectric layer etching process has started removing portions of dielectric layer 26 located below etch window 30 to form initial etched opening 32. For example, etching tool 36 can be a plasma-based etching tool that exposes portion 10 to anisotropically etching plasma 34. Even assuming that plasma 34 has a high selectivity between dielectric layer 26 and underlying stop layer 22 as is preferred, portions of stop layer 22 are nonetheless removed when exposed to plasma 34.

As shown in FIG. 2b, the higher portions of stop layer 22, which are located below etch window 30 and above gate 16/silicide 18 and spacer 20, are exposed to plasma 34 for the longest period of time. These higher portions, and in particular the corner region 38 of stop layer 22, can be etched away during the dielectric layer etching process which exposes the underlying materials to plasma 34. If corner region 38 is etched away, then the material of underlying spacer 20 is exposed to plasma 34. Portions of spacer 20 may then be etched away.

The material of spacer 20 is typically a thin oxide or nitride. If spacer 20 is an oxide spacer, then plasma 34 will etch all or part of spacer 20 during the dielectric layer etching process if dielectric layer 26 is a similar oxide material. If spacer 20 is another material, such as, for example, nitride, then the amount of material removed by plasma 34 will vary depending on the selectivity of plasma 34 to that material. When the critical dimensions are decreased, such that the aspect ratio of the etched opening is increased, it is possible to significantly remove most or all of spacer 20 during the dielectric layer etching process and thereby undesirably expose substrate 12 to plasma 34. As mentioned, spacer 20 tends also to be very thin which can worsen the problem. For example, spacer 20 in certain arrangements is approximately 500 to 700 Å thick.

In FIG. 2c, the dielectric layer etching process has been completed and the portion of stop layer 22 below etch window 30 has been anisotropically etched away in etching tool 36 using a second plasma 44. Consequently, an etched opening 40 is thereby created that extends through dielectric layer 26 and stop layer 22 to expose selected portions of substrate 12 and gate 16/silicide 18. Etched opening 40 can then be filled with one or more conductive materials to form a local interconnect.

As shown, however, there is a punch-through region 42 that extends into substrate 12. Punch-through region 42 has been formed by etching into substrate 12 with either plasma 34 and/or second plasma 44. For example, punch-through region 42 can form during the dielectric etching process in which plasma 34 etches through corner region 38, spacer 20 and into substrate 12. The subsequent stop layer etching process can further cause and/or increase punch-through region 42.

Punch-through region 42 is deleterious because the active and/or other regions formed within substrate 12 can be damaged. For example, the interface between drain region 24b can be damaged and/or the conductive and/or resistive properties of the various regions can be significantly altered.

The methods in accordance with the present invention substantially reduce the chances of over-etching into substrate 12 by intentionally removing spacers 20 prior to forming stop layer 22 and dielectric layer 26. By removing spacers 20, the topology and underlying structure of corner region 38 is changed and the chances of over-etching and forming a forming punch-through region 42 are significantly reduced.

Figure 3A:
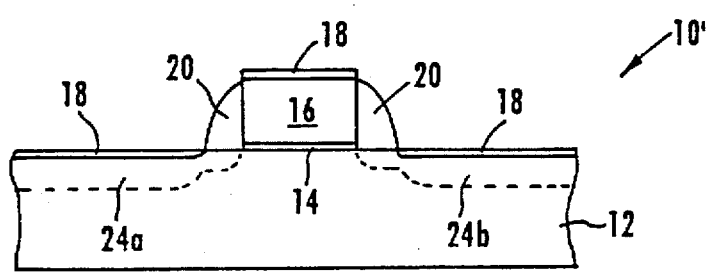
FIG. 3a depicts a cross-section of a portion of a semiconductor wafer having a substrate, a gate, and sidewall spacers following formation of a source region and a gate region, in accordance with one embodiment of the present invention.

With this in mind, FIG. 3a depicts an improved portion 10' of a semiconductor wafer, in accordance with an exemplary embodiment of the present invention. Portion 10' is similar to portion 10 in FIG. 1 and like referenced elements are the same. Source and drain regions 24a–b have been formed within substrate 12 using gate 16 and spacers 20 as a mask, and silicide 18 has been formed on gate 16 and source and drain regions 24a–b.

Figure 3B:
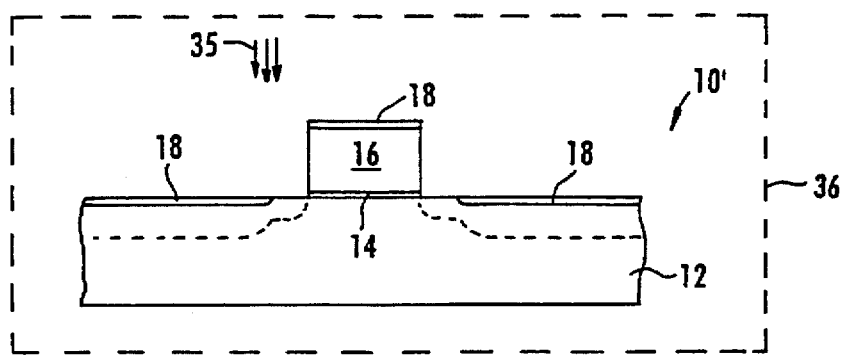
FIG. 3b depicts the portion of FIG. 3a following removal of at least a substantial portion of the sidewall spacers using an isotropic etching process, in accordance with one embodiment of the present invention.

In accordance with the present invention, all or most of each spacer 20 is removed as depicted in FIG. 3b. For example, portion 10' can be placed in etching tool 36 and substantial portions of spacer 20 isotropically etched away by a plasma 35. Plasma 35 preferably exhibits a high selectivity between the material in spacer 20 and the exposed and/or underlying materials of portion 10'. While it is preferred that all of spacer 20 be removed, it is also recognized that removing substantial portions of spacer 20 can alter the structure/topology enough to prevent overetching and spacer-related punch through effects.

Figure 3C:
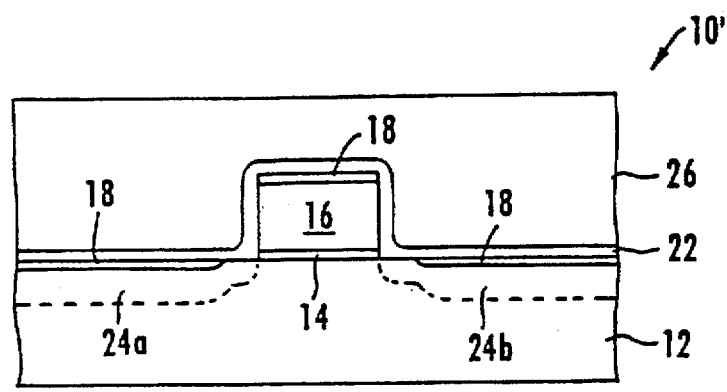
FIG. 3c depicts the portion of FIG. 3b following deposition of a stop layer and a dielectric layer, in accordance with one embodiment of the present invention.

As seen in FIG. 3c, having removed all or most of spacer 20, stop layer 22 is formed on substrate 12/silicide 18 and gate 16/silicide 18. Dielectric layer 26 is then formed on stop layer 22. For example, stop layer 22 and dielectric layer 26 can be formed using conventional deposition techniques, such as, chemical vapors deposition (CVD) or plasma enhanced CVD (PECVD) techniques. FIG. 3c depicts portion 10' having stop layer 22 and dielectric layer 26. Portion 10' in FIG. 3c is similar to portion 10 in FIG. 1, except that each spacer 20 is absent.

Figure 3D:
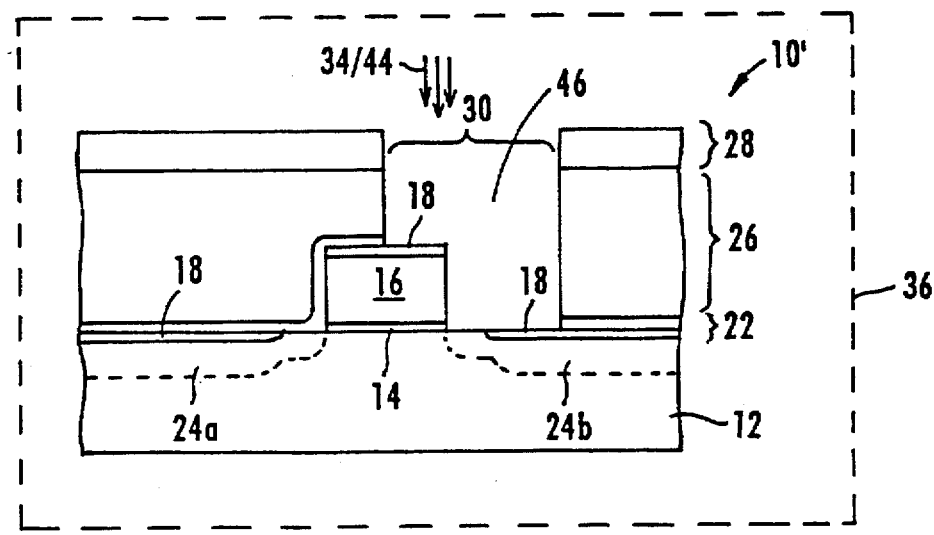
FIG. 3d depicts the portion of FIG. 3c having an etched opening that does not include a punch-through region extending into the substrate as a result of a dielectric layer etching process and a stop layer etching process, in accordance with one embodiment of the present invention.

As depicted in FIG. 3d, an etched opening 46 has been formed within at least one etching tool 36 using plasma 34 and second plasma 44. Plasma 34, as described above, has a high selectivity between dielectric layer 26 and stop layer 22. Second plasma 44 has a high selectivity between stop layer 22 and substrate 12. Preferably, second plasma 44 also exhibits a high selectivity between stop layer 22 and dielectric layer 26. Etched opening 46 was formed through etch window 30 and extends through dielectric layer 26 and stop layer 22 to reveal portions of the underlying materials, such as, gate 16/silicide 18 and substrate 12/silicide 18. As shown, the underlying materials, and in particular substrate 12 has not been over-etched and there is no punch-through region as in the prior-art.

Figure 4:
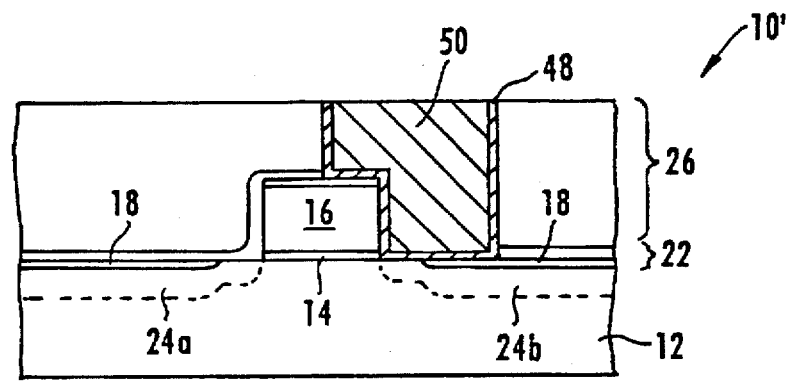
FIG. 4 depicts the portion of FIG. 3d following formation of a local interconnect within the etched opening.

Etched region 46 is then filled with one or more conductive materials to form a local interconnect. In FIG. 4, portion 10' is depicted as having a glue layer 48 and a plug material 50, which are each conductive, within etched region 46. For example, in one embodiment, glue layer 48 includes titanium/titanium nitride (Ti/TiN) and plug material 50 includes tungsten (W).

The methods of the present invention increase the process control and the resulting yields tend to outweigh the costs of the added steps. As part of the present invention, it was recognized that the thin films associated with the decreasing dimensions and the topology of the gate/spacer structure creates the potential for punch-through into the substrate and/or other underlying regions. By intentionally removing all or most of the spacers prior to forming the stop layer, the present invention provides an unconventional approach to altering the structure of the gate so as to prevent spacer-related punch-through problems.

Although the present invention has been described and illustrated in detail, it is to be clearly understood that the same is by way of illustration and example only and is not to be taken by way of limitation, the spirit and scope of the present invention being limited only by the terms of the appended claims.

What is claimed is:

1. A method for avoiding over-etching into an underlying substrate during the formation of one or more local interconnects in a semiconductor wafer, the method comprising:

forming a semiconductor device having a gate arrangement, a source region and a drain region, wherein the source region and the drain region are formed within a substrate, and the gate arrangement is formed on the substrate and includes a gate and at least one spacer that contacts the gate and the substrate, wherein the spacer is a dielectric; and removing at least a substantial portion of the spacer from the semiconductor device;

and then forming a first dielectric layer over at least a portion of the semiconductor device.

2. The method as recited in claim 1, further comprising;

selectively removing a portion of the first dielectric layer to expose a portion of the underlying semiconductor device through an opening; and creating a local interconnect by filling at least a portion of the opening with at least one electrically conductive material.

3. The method as recited in claim 1, wherein the gate arrangement includes a silicon dioxide layer on the substrate and the gate includes polysilicon and is formed on the silicon dioxide layer.

4. The method as recited in claim 3, wherein the spacer includes an oxide.

5. The method as recited in claim 3, wherein the spacer includes nitride.

6. The method as recited in claim 1, further comprising forming a second dielectric layer over the first dielectric layer, wherein the first and second dielectric layers are different materials.

7. The method as recited in claim 6, further comprising:
selectively removing a portion of the first and second dielectric layers to expose a portion of the semiconductor device through an opening; and
creating a local interconnect by filling at least a portion of the opening with at least one electrically conductive material.

8. The method as recited in claim 7, wherein selectively removing a portion of the first and second dielectric layers includes using an etching tool to etch through the first and second dielectric layers.

9. The method as recited in claim 8, wherein the etching through of the first and second dielectric layers includes anisotropically etching through the first dielectric layer with a first plasma and anisotropically etching through the second dielectric layer with a second plasma.

10. The method as recited in claim 1, wherein removing the spacer from the semiconductor device includes isotropically etching away at least a substantial portion of the spacer with an etching tool.

* * * * *